(12) United States Patent
Yeung et al.

(10) Patent No.: US 9,391,007 B1
(45) Date of Patent: Jul. 12, 2016

(54) BUILT-UP LEAD FRAME QFN AND DFN PACKAGES AND METHOD OF MAKING THEREOF

(71) Applicant: NXP B.V., Eindhoven (NL)

(72) Inventors: Shun Tik Yeung, Hong Kong (HK); Pompeo V. Umali, Ma Wan (HK); Chi Ho Leung, Kwun Tong (HK); Kan Wae Lam, Ta Kwu Ling (HK); Chi Ling Shum, Hong Kong (HK)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/746,474

(22) Filed: Jun. 22, 2015

(51) Int. Cl.
| | | |
|---|---|---|
| H01L 21/00 | (2006.01) | |
| H01L 23/495 | (2006.01) | |
| H01L 21/48 | (2006.01) | |
| H01L 21/56 | (2006.01) | |
| H01L 21/78 | (2006.01) | |
| H01L 23/31 | (2006.01) | |
| H01L 25/00 | (2006.01) | |

(52) U.S. Cl.
CPC ...... *H01L 23/49575* (2013.01); *H01L 21/4825* (2013.01); *H01L 21/4842* (2013.01); *H01L 21/565* (2013.01); *H01L 21/78* (2013.01); *H01L 23/3114* (2013.01); *H01L 23/49513* (2013.01); *H01L 23/49541* (2013.01); *H01L 25/50* (2013.01)

(58) Field of Classification Search
CPC ............ H01L 2224/3225; H01L 2224/73267; H01L 2224/8203; H01L 2224/04105; H01L 2224/24226; H01L 2224/92244; H01L 24/25; H01L 24/82; H01L 24/24
USPC .......... 257/788, 784, 737–738; 438/612, 614, 438/617, 106–109, 112, 113, 127, 613, 124
See application file for complete search history.

(56) References Cited

U.S. PATENT DOCUMENTS

| | | |
|---|---|---|
| 8,049,324 B1 | 11/2011 | Zeta |
| 8,076,181 B1 | 12/2011 | Pruitt et al. |
| 2007/0152319 A1 | 7/2007 | Takiar et al. |
| 2007/0278701 A1 | 12/2007 | Chang et al. |
| 2008/0303166 A1 | 12/2008 | Liao et al. |
| 2012/0181678 A1 | 7/2012 | Groenhuis et al. |
| 2013/0001757 A1* | 1/2013 | Chia ................... H01L 23/4334 257/675 |

FOREIGN PATENT DOCUMENTS

WO      2012/040873 A1      4/2012

* cited by examiner

*Primary Examiner* — Hoa B Trinh

(57) ABSTRACT

Consistent with an example embodiment, a semiconductor device comprises a device die having bond pads providing connection to device die circuitry. The semiconductor device includes a QFN package (quad-flat-pack no-leads) built-up substrate lead frame having, a sub-structure of I/O terminals and a die attach area, the I/O terminals and die attach area enveloped in a molding compound; the die attach area has exposed areas to facilitate device die attachment thereon and the terminal I/O terminals provide connection to the device die bond pads. I/O terminals are electrically coupled with one another and to the die attach area with connection traces. The coupled I/O terminals and connection traces facilitate electroplating of exposed vertical surfaces of the I/O terminals during assembly, said connection traces being severed after assembly. Molding compound encapsulates the device die on the built-up substrate lead frame. The exposed vertical surfaces of the I/O terminals enhance the solderability of the assembled QFN device during placement onto a printed circuit board.

10 Claims, 6 Drawing Sheets

BUILT-UP LEAD FRAME QFN AND DFN PACKAGES AND METHOD OF MAKING THEREOF

FIELD

This disclosure relates to integrated circuit (IC) packaging. More particularly, this disclosure relates to a quad-flat-pack leadless (QFN) and depopulated-very-thin flat-pack no leads (DFN) packaged semiconductor devices and a method of making thereof.

BACKGROUND

The electronics industry continues to rely upon advances in semiconductor technologies to realize higher-function devices in more compact areas. For many applications realizing higher-functioning devices requires integrating a large number of electronic devices into a single silicon wafer. As the number of devices per given area of the silicon wafer increases, the manufacturing process becomes more difficult.

Many varieties of semiconductor devices have been manufactured having applications in various disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Having manufactured a number of electronic devices on a wafer substrate, a particular challenge is to package these devices for their given purpose. As the complexity of portable systems increases, there is a commensurate need to reduce the size, enhance the electrical performance, and enhance the thermal performance of the individual components which make up the system as the device is often laid out on a printed circuit substrate. There is a need for packaging which can address these challenges.

SUMMARY

One significant challenge in the mounting of devices onto a printed circuit board (PCB) is maintaining the integrity of the solder connection between I/O terminals of the device and corresponding landings on the PCB. One bad solder connection (i.e., a "cold joint") may render a complex mobile device useless. Thus, a manufacturer of the mobile device needs a way to efficiently judge the quality of the solder connection. The present disclosure uses a built-up substrate lead frame whose I/O terminals are shorted together with conduction traces, so that during the sawing and singulation process, the vertical faces of the I/O terminals on a given package used, may be exposed and electroplated with a solderable metal such as tin (Sn) or alloys thereof. After the sawing and singulation the short-circuit connections of the I/O terminals are severed. The I/O terminals connect corresponding connections of the encapsulated device die. The I/O terminals are plated on all exposed surfaces. The plated vertical face provides the user a convenient view of the solder quality. If the soldering looks good on the vertical face, likely the underside surface solder interface between the I/O terminal and corresponding PCB landing is all right. There is sufficient electrical conductivity and mechanical strength.

According to an aspect of the present disclosure there is provided a method for forming a semiconductor device in a quad-flat-no-leads (QFN) chip carrier having a pre-plated and pre-molded lead frame assembly having an array of QFN sub-assemblies each having a device die arranged thereon, the sub-assemblies having I/O terminals surrounding the device die on its four sides, electrically connected to the device die, and the I/O terminals mutually connected to one another by connection traces. The method comprises encapsulating, in an additional molding compound, the device die arranged on a topside surface of the array of QFN sub-assemblies of the pre-plated and pre-molded lead frame assembly. On an underside surface of the array of QFN sub-assemblies, in a first direction in a series of parallel cuts in a saw lane, the I/O terminals are cut through between adjacent, to a depth such that an un-plated horizontal terminal I/O lead portion is exposed, thereby exposing un-plated vertical surfaces of the I/O terminals; on the underside surface of the array of QFN sub-assemblies, in a second direction in a series of parallel cuts in another saw lane, the second direction angled with respect to the first direction. There is a second series of cutting through the I/O terminals between adjacent, to a depth such that an un-plated horizontal terminal I/O lead portion is exposed, thereby exposing un-plated vertical surfaces of the I/O terminals. The mutually connected I/O terminals are electroplated to form plated vertical and horizontal surfaces. The array of QFN sub-assemblies are singulated into individual devices.

In an example embodiment, in the series of cuts, the first direction of is in the X-direction and the second direction is in the Y-direction.

In an example embodiment, the connection traces electrically couple to one another at the I/O terminals between adjacent devices in the lead frame assembly, and wherein thin connection traces further couple the I/O terminals with die attach areas in the lead frame assembly.

In an example embodiment, on the topside surface of the lead frame assembly, the connection traces are co-planar with one another and surfaces of the I/O terminals.

According to another aspect of the present disclosure, there is a semiconductor device assembled in a flat no-leads (FN) package. The semiconductor device comprises a device die having bond pads providing connection to device die circuitry; a built-up substrate FN lead frame has a sub-structure of I/O terminals and a die attach area, the I/O terminals and die attach area enveloped in a first molding compound, the die attach area having exposed areas to facilitate device die attachment thereon and the I/O terminals providing connection to the device die bond pads, connection traces electrically coupling the I/O terminals with one another, said connection traces having facilitated electroplating of exposed vertical surfaces of the I/O terminals during assembly, said connection traces being severed after assembly. A second molding compound encapsulates the device die onto the built-up substrate lead frame, the device die bonded to the die attach area, the device die bond pads connected to the I/O terminals; and the I/O terminals have a stepped profile, the stepped profile having a plated vertical first face, a plated lead frame portion perpendicular to the plated vertical first face, and an exposed un-plated second vertical face perpendicular to the plated lead frame portion, the exposed un-plated second vertical surface enveloped in the second molding compound.

In an example embodiment, the semiconductor device has the connection traces that are co-planar with one another and a surface of the I/O terminals, and the die attach area and the connection traces electrically couple to one another. The connection tracks are oriented in X, Y and diagonal directions of the built-up substrate lead frame.

In an example embodiment, the FN lead frame is selected from one of the following: quad-flat-pack leadless (QFN) and depopulated-very-thin flat-pack no leads (DFN).

According to another aspect of the present disclosure, there is a method for making a FN built-up lead frame whose I/O terminals can be electroplated on their vertical surfaces. The method comprises selecting an FN lead frame assembly structure, the FN lead frame assembly structure has an array of sub-assemblies. Each sub-assembly has a device position arranged thereon; the device die position has a first set I/O terminals on first side and on an opposite second side and a second set of I/O terminals on an adjacent third side and opposite fourth side, wherein the device die position and the first set and second set of I/O terminals are electrically connected to one another. A molding of the lead frame assembly structure, thereby forms a built-up lead frame assembly structure, wherein the molding and lead frame assembly structure are coplanar with one another.

In an example embodiment, the I/O terminals further include connection traces that are co-planar with one another and a surface of the I/O terminals and the die attach area. The connection traces electrically couple to one another and the I/O terminals; the connection traces are oriented in X, Y and diagonal directions of the built-up substrate lead frame.

In an example embodiment, the FN built-up lead frame is selected from the following: quad-flat-pack leadless (QFN) and depopulated-very-thin flat-pack no leads (DFN).

The above summaries of the present invention are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1:
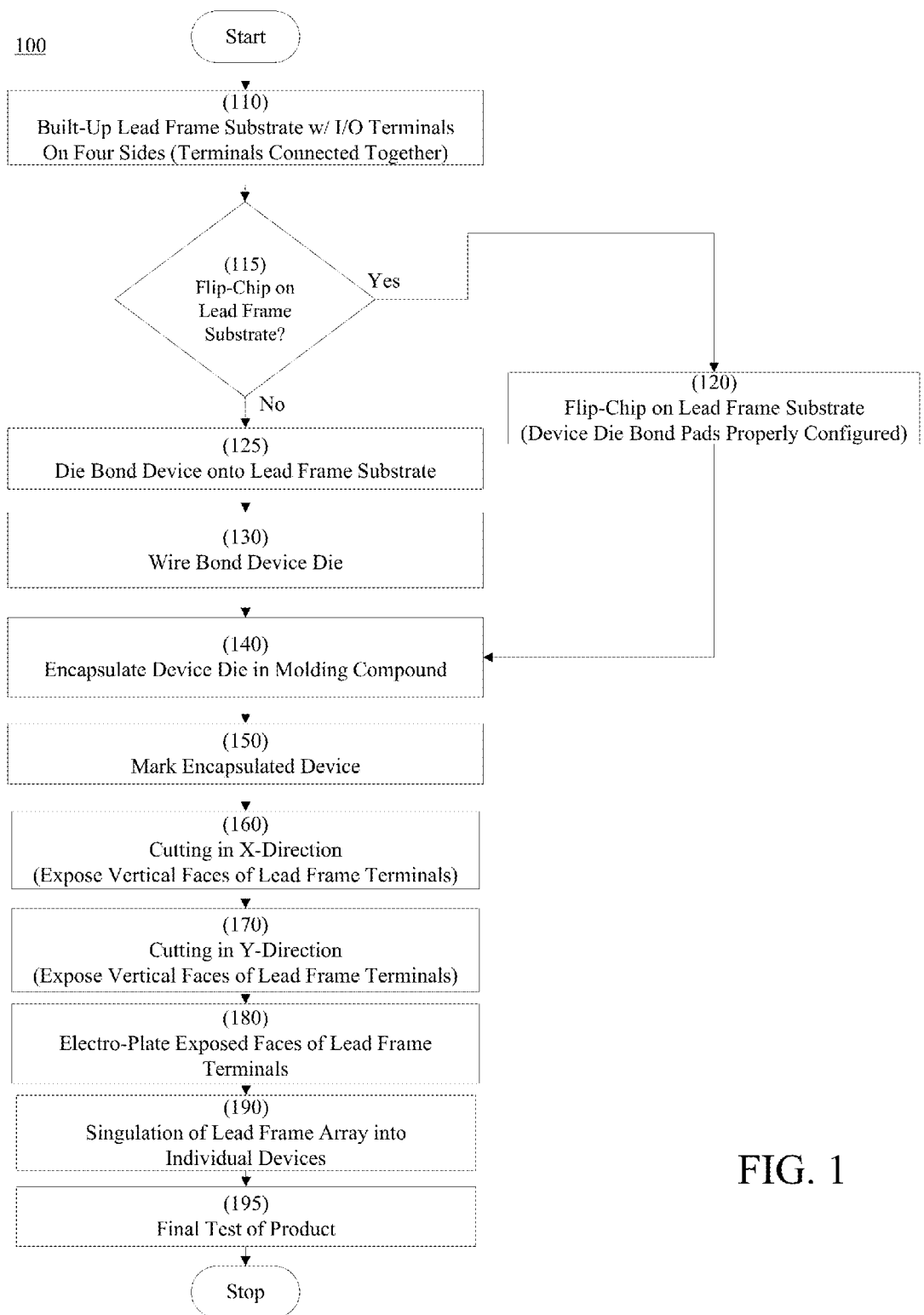
FIG. 1 is a flow diagram of the making of a device according to an embodiment of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present disclosure has been found useful in addressing the challenges of packaging of semiconductor devices used in portable systems. Leadless packaged semiconductor devices, whose leads surround the device die on all four sides, are known to provide advantages over leaded packages. Those advantages include better electrical performance in terms of reduced lead inductance, good heat dissipation by use of an exposed thermal pad to improve heat transfer to a PCB (printed circuit board), reduced package thickness and smaller footprint, which reduces the area occupied on a PCB. Examples of leadless packaged semiconductor devices include QFN (quad-flat no-lead devices) and DQFN (discrete-flat no-lead devices). However, a disadvantage of leadless packaged semiconductor devices is that inspection of solder joints when mounted on a PCB can be difficult. Conventional inspection techniques utilize so-called Automated Optical Inspection (AOI) systems, whereby a camera scans the leadless packaged semiconductor devices mounted on the PCB for a variety of defects such as open circuit connections, short circuit connections, thinning of the solder connections and incorrectly placed devices. Due to the semiconductor device I/O terminals being arranged on the bottom of the device, and therefore hidden from view when the device is mounted a PCB, it is not generally possible to use AOI systems with leadless semiconductor devices. Automatic X-Ray Inspection (AXI) systems may allow inspection of solder joints, however AXI systems are expensive.

A solution allowing solder joints to be inspected by AOI is to include a metal side pads that extend from the device I/O terminals on the bottom of the device at least partially up external sidewall of the device. Typically the metal side pads may be formed of tin, lead or tin-lead alloys. During soldering processes attaching the device to the PCB, the solder will wet the I/O terminal on the bottom of the device and also the metal side pads. As a result a portion of the solder joint will be visible allowing inspection by AOI techniques. The solder joint may be considered good, provided that the metal side pads are correctly soldered even if the I/O terminal is not correctly soldered to the PCB.

In addition to ease of inspection, metal side pads may reduce tilting of the device when mounted on a PCB. Metal side pads may also improve shearing and bending performance because of the increased soldered area.

The present disclosure has been found useful in assuring that the I/O terminals can be plated on their vertical side surfaces. A package according to the present disclosure would include a metal sub-assembly, usually of tin-plated copper, with the device contacts encapsulated in a molding compound (i.e., a "built-up" lead frame). On one side upon which device die are attached, the device contacts are flush and planar with the molding compound. On an opposite side, the contacts of the built-up lead frame are also enveloped with molding compound and are also flush and planar with the molding compound; these contacts connect the device to a user's printed circuit board. Depending upon the device die size and complexity, such a sub-assembly is an array of a few dozen to perhaps, thousands of devices. The number of I/O terminals may range from fewer than eight to many hundreds. To assure that the I/O terminals can be plated on their vertical side surfaces, in the QFN package array, the I/O terminals are electrically coupled to one another. Thus, during the sawing and singulation process, the vertical faces of I/O terminals, which are electrically connected to one another, can be electroplated with a solderable surface, such as tin (Sn) or alloys, thereof.

Electroplating is a process that uses electric current to reduce dissolved positive ions (i.e., cations) of metal from the tin anode, so that they form a coherent metal coating on an electrode, the electrode (i.e, cathode) being the un-plated surfaces of the I/O terminals receiving the metal coating. In the present disclosure, this metal coating may be tin (Sn).

Refer to FIG. 1. In an example process 100, a built-up lead frame is configured according to an embodiment of the present disclosure. In step 110, a lead frame, with an array of device positions, with pins electrically coupled via connection traces is selected. The user may select assembly with either wire bonding or flip-chip bonding, in step 115. In some applications, wire bonding may be suitable. In step 125 active device die are bonded to the lead frame or substrate. After die bonding, in step 130, the device die are wire bonded to the lead frame. In other applications, flip-chip bonding, step 120, is appropriate. Having completed making the device connections to the package, the lead frame is encapsulated in a molding compound in step 140. After the molding, the devices may be marked at step 150. In step 160, sawing in a first direction ("X" direction) cuts through the underside surface (which consists of a molding compound or equivalent material) of the built-up lead frame and exposes vertical side faces of a first group lead frame terminals of each device die position. Likewise, in step 170, sawing in a second direction ("Y" direction) cuts through the underside surface of the built-up lead frame and exposes vertical side faces of a second group lead frame terminals of each device die position. The encapsulation performed in step 140, keeps the array rigid and together. The design of the lead frame shorts the I/O terminals together so that in step 180, these exposed terminals may undergo an electroplating of tin (Sn). In step 190, a singulation sawing in a both directions ("X" and "Y") separates the array of devices from one another into individual devices and severs the connection traces to the pins. The individual devices undergo a final test in step 195.

In another example embodiment, the cutting (in steps 160 and 170) in the "X" and "Y" directions may be accomplished with a laser. The laser is adapted to cleanly cut through the underside molding compound.

Figure 2A:
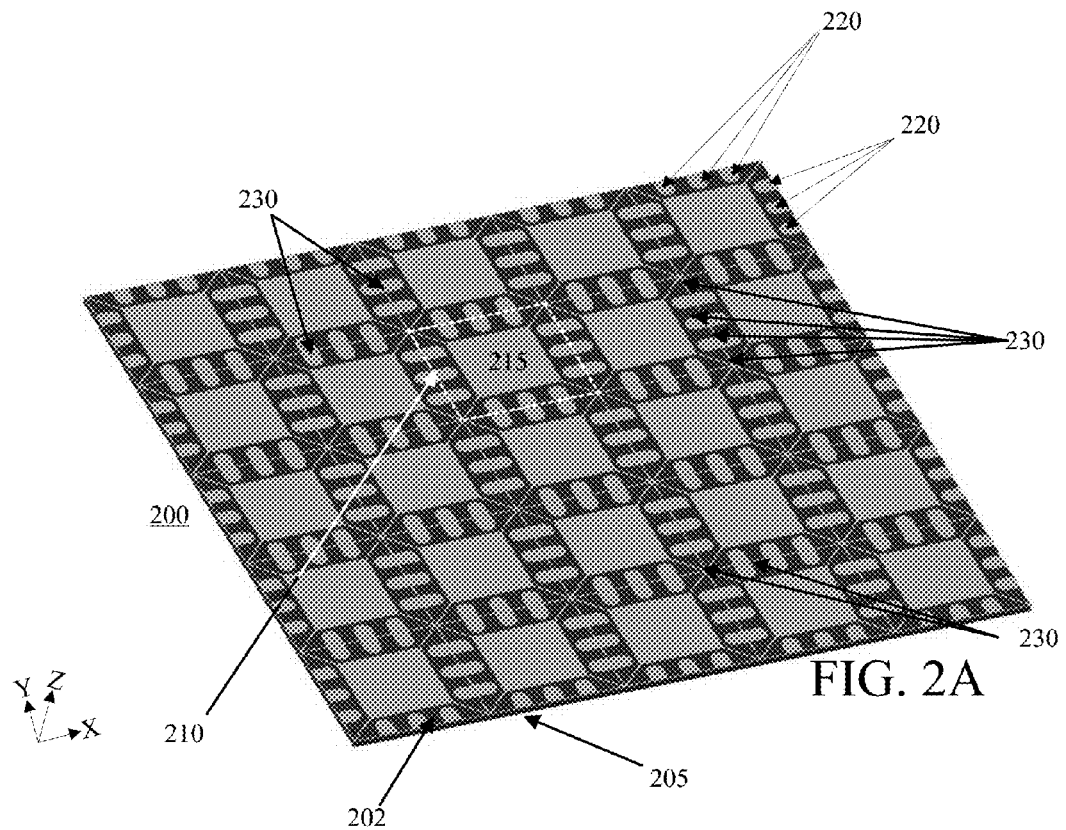
FIGS. 2A-2G are perspective views of an example QFN lead frame that may be used in assembling a device according to an embodiment of the present disclosure.
Figure 2B:
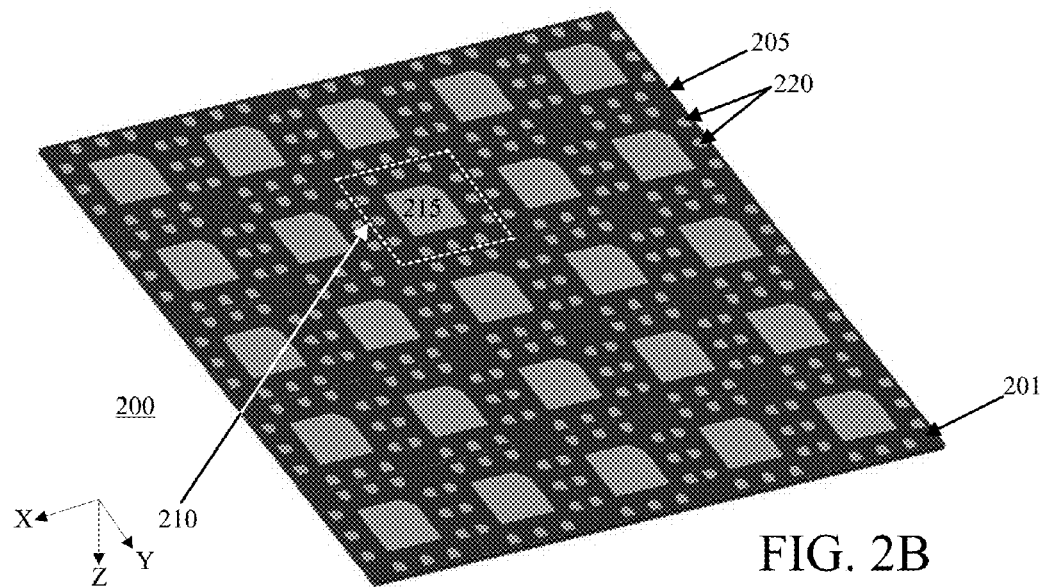

Refer to FIGS. 2A-2G. In FIG. 2A, from a topside perspective view, a QFN built-up lead frame 200 (i.e., a QFN12, having twelve I/O terminals) having a substrate 205 (of a molding compound or other suitable material) has a plurality of device die positions 215 (arranged in a 5×5 array) for an individual package areas 210 on the topside surface 202. Twelve bond pads 220 provide connections to a device die and external leads. These bond pads 220 are electrically coupled to one another at adjacent individual package areas 210 and with connection traces 230. The connection traces 230 surround each package area 210. The bond pads 220 are electrically shorted together. Refer to FIG. 2B. The built-up QFN lead frame 200, from an underside 201 perspective view, the plurality of device die positions 215 are part of the package areas 210. The substrate 205 envelopes each package area 210.

Figure 2C:
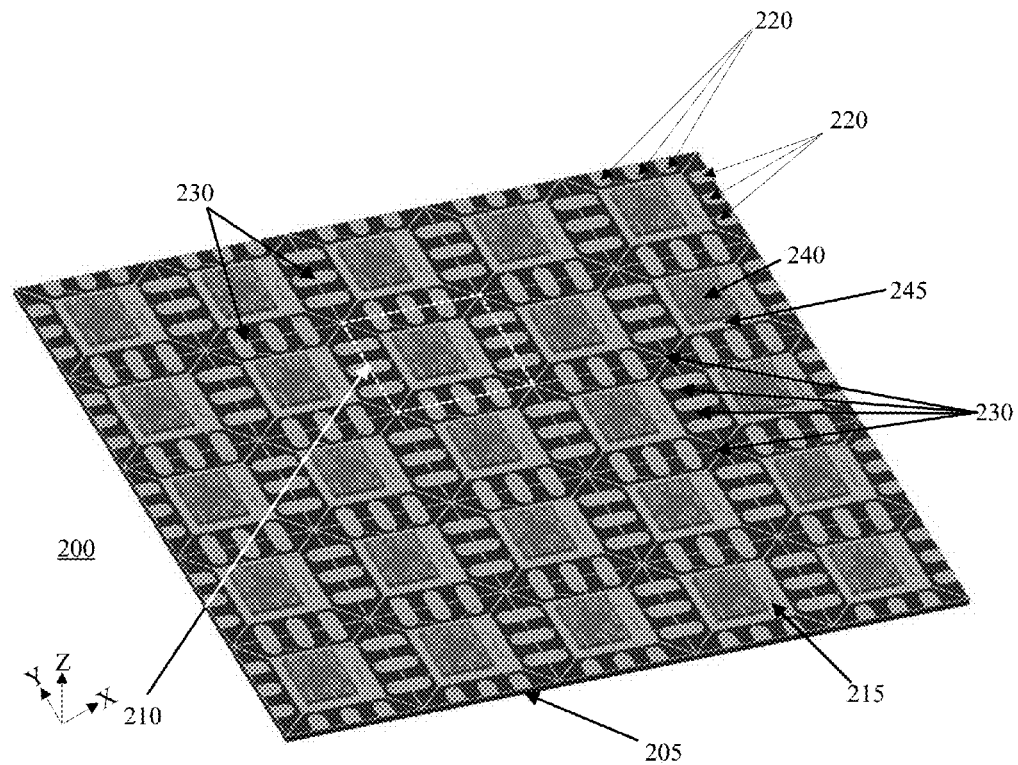
Figure 2D:
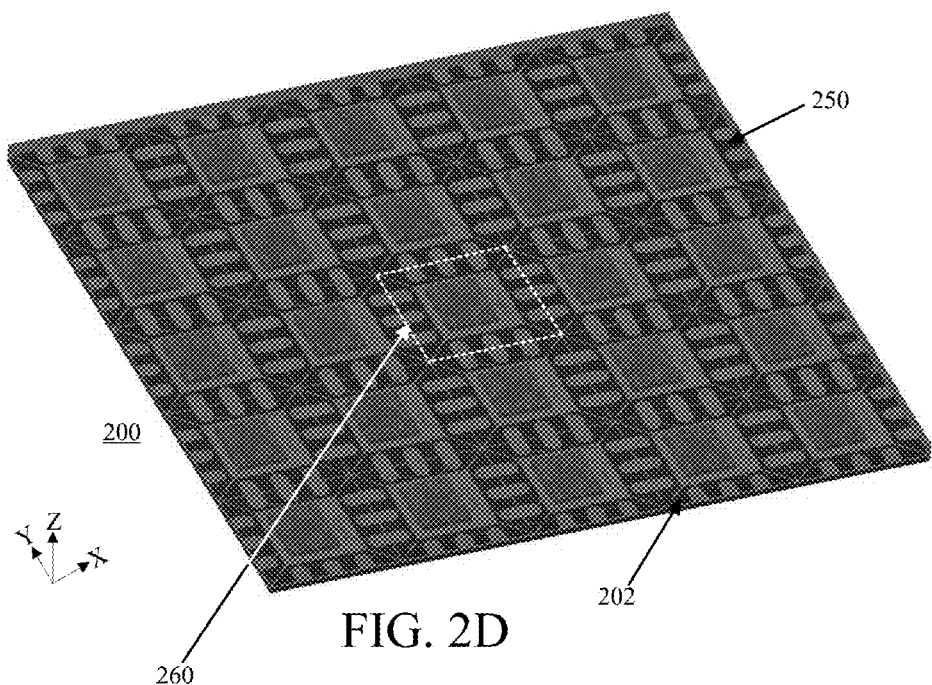

Refer to FIG. 2C. In the plurality of device positions 215, device die 240 are attached onto device die positions 215. Wire bonds 245 electrically connect the bond pads of the device 240 with pad landings on the I/O terminals 220. Connection traces 230 electrically couple to one another each of the device die positions 215. Refer to FIG. 2D. The array 200, with an additional molding compound 250, the assembled devices 260 are encapsulated.

Figure 2E:
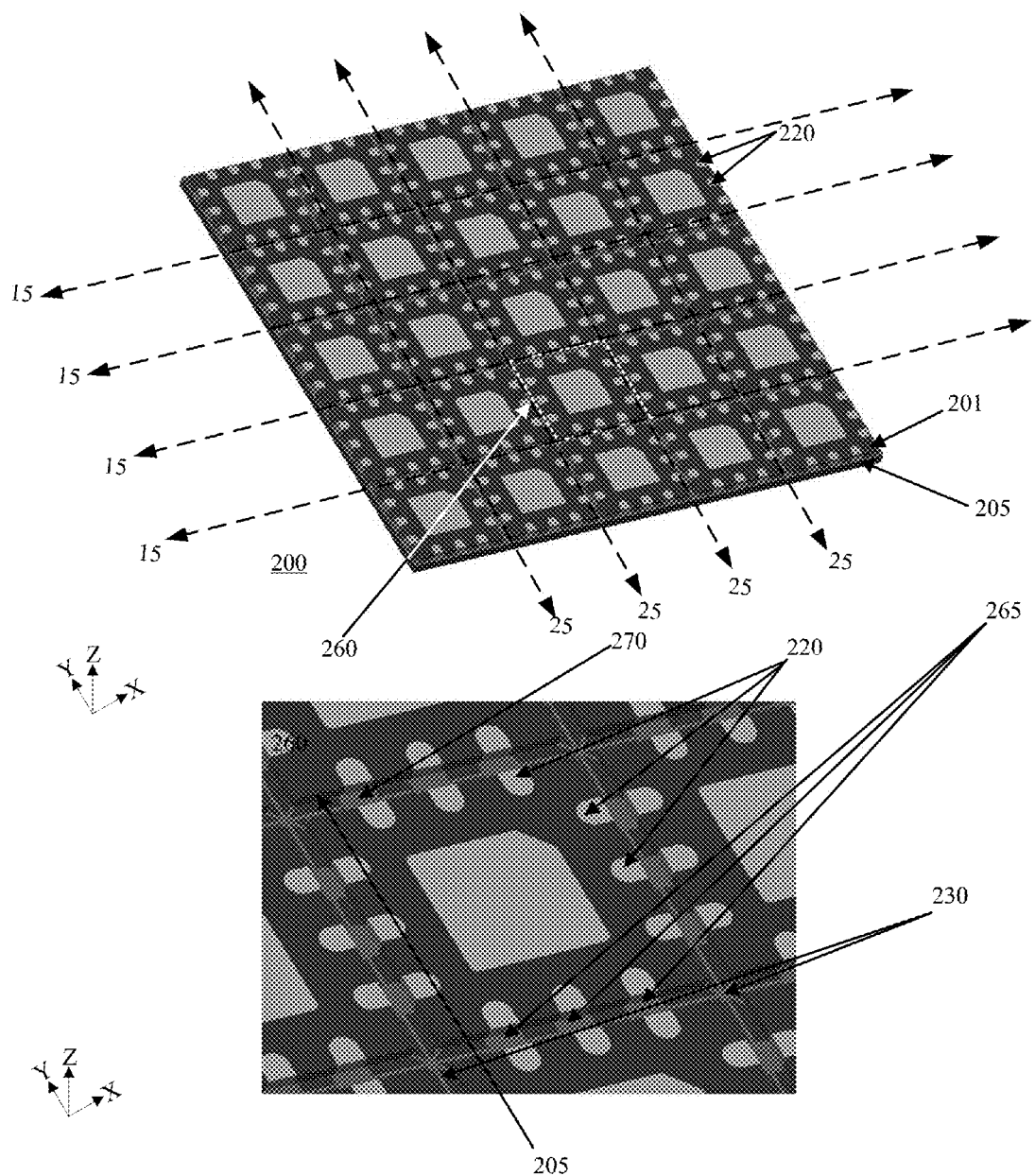

Refer to FIG. 2E. On the array 200 underside surface 201, with a saw cut 15 in the X-direction, the sawing cuts through the substrate 205 and perpendicularly through the saw lanes between of the bond pads 220 and exposing the corresponding vertical faces 265. These vertical faces 265 are un-plated copper (Cu). The cutting goes to a depth until un-plated copper of the lead frame 200 is exposed (i.e., the horizontal face 270 of a lead frame portion perpendicular to the vertical face 265). This un-plated copper 270 is the areas in which adjacent bond pads 220 are electrically connected to one another; these in turn, are electrically coupled to the connection traces 230. A saw cut 25 in the Y-direction, exposes corresponding parts of the lead frame 200, as well.

In another example process according to the present disclosure, the array 200 may be cut in the X and Y directions with a laser cutting tool. The laser cutting tool would be adapted to cut through the substrate 205 molding compound of the built-up substrate 200.

Figure 2F:
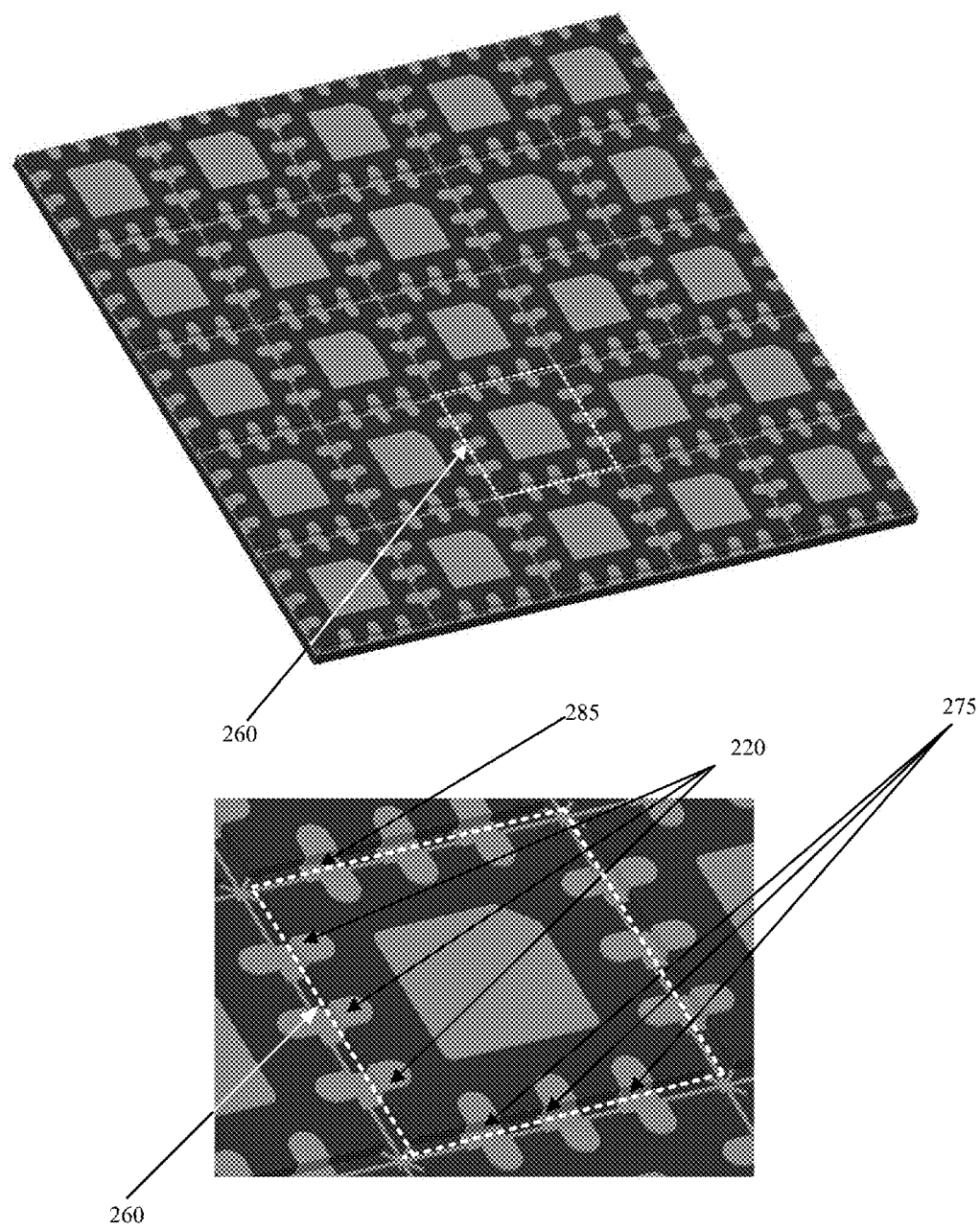

Refer to FIG. 2F. After the saw cuts 15 and 25, there are twenty-five devices 260 whose I/O terminals 220 have exposed vertical faces 265 and horizontal surfaces of lead frame portions 270 (Refer back to FIG. 2E). An electroplating of tin results in plated vertical faces 275 and lead frame portions 285. Following the plating, a singulation sawing separates the array 200 of devices 260 into individual parts.

Figure 2G:
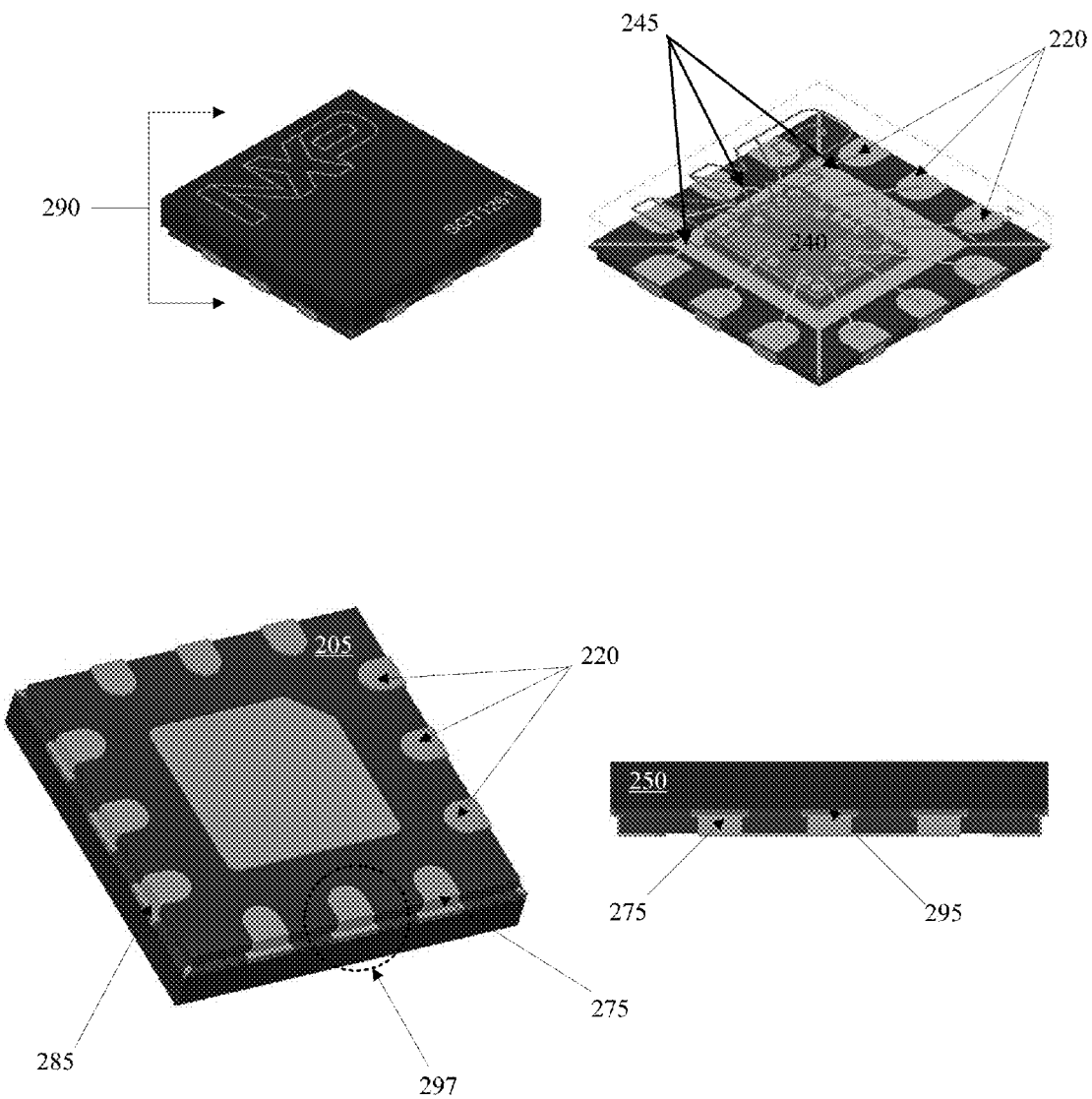

Refer to FIG. 2G. An individual device 290 is shown in four prospective views. On the device 290 underside, the plurality of I/O terminals 220 are plated along with their corresponding vertical faces 285 and horizontal lead frame portions 275. The device die 240 has wire bonds 245. The wire bonds 245 connect to I/O terminals 220. The I/O terminals 220 have a stepped profile 297. A second vertical face 295, as a result of the singulation sawing, is un-plated. However, this un-plated portion does not affect the solderability of the completed device 290 when attached to a user's printed circuit board sub-system. Upon mounting, the completed device 290 has an overhang of the width the horizontal lead frame portion 275.

The present disclosed embodiments are suitable for a number of package types such as QFN (Quad Flat No-leads), HVQFN (Heatsink Very-thin Quad Flat-pack No-leads), or DFN (Depopulated very-thin-Flat No-lead devices), but is not necessarily limited to these types. The number of terminals in a packaged assembled according to the instant disclosure is not limited; the number may be less than ten to over a hundred. The number of devices arrayed in a production tooling varies with the lead frame size and lead frame strip size. Some example packages are shown in Table 1.

TABLE 1

Example Packages

| Description | Dimensions | Family | Lead Frame Size | Approximate Number of Devices Arrayed in Tooling |
|---|---|---|---|---|
| QFN12 (FIGS. 2A-2G) | 3 mm × 3 mm × 0.85 mm | QFN | 240 mm × 70 mm | 67 × 17 = 1173 pcs. |
| HVQFN16 (SOT758) | 3 mm × 3 mm × 0.85 mm | QFN | 240 mm × 70 mm | 67 × 17 = 1173 pcs. |
| HVQFN88 (SOT906) | 10 mm × 10 mm × 0.85 mm | QFN | 240 mm × 70 mm | 22 × 5 = 110 pcs. |
| DFN2 (SOD882) | 1 mm × 0.6 mm × 0.5 mm | DFN | 185 mm × 53 mm | 52 col. × 36 row × 4 block = 7488 pcs. |
| XSON6 (SOT891) | 1 mm × 1 mm × 0.5 mm | DFN | 185 mm × 53 mm | 35 col. × 36 row × 4 block = 5040 pcs. |

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts, based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the disclosure will be apparent to persons skilled in the art without departing from the spirit and scope of the disclosure as defined in the appended claims.

The invention claimed is:

1. A method for forming a semiconductor device in a quad-flat-no-leads (QFN) chip carrier having a pre-plated and pre-molded lead frame assembly having an array of QFN sub-assemblies each having a device die arranged thereon, the QFN sub-assemblies having I/O terminals surrounding the device die on its four sides, electrically connected to the device die, and the I/O terminals mutually connected to one another by connection traces, the method comprising:
   encapsulating, in an additional molding compound, the device die arranged on a topside surface of the array of QFN sub-assemblies of the pre-plated and pre-molded lead frame assembly;
   on an underside surface of the array of QFN sub-assemblies, in a first direction in a series of parallel cuts in a saw lane, cutting through the I/O terminals between adjacent QFN sub-assemblies, to a depth such that an un-plated horizontal terminal I/O lead portion is exposed, thereby exposing un-plated vertical surfaces of the I/O terminals;
   on the underside surface of the array of QFN sub-assemblies, in a second direction in a series of parallel cuts in another saw lane, the second direction angled with respect to the first direction, the second series of cutting through the I/O terminals between adjacent, to a depth such that an un-plated horizontal terminal I/O lead portion is exposed, thereby exposing un-plated vertical surfaces of the I/O terminals; and
   electroplating the mutually connected I/O terminals to form plated vertical and horizontal surfaces;
   singulating the array of QFN sub-assemblies into individual devices.

2. The method as recited in claim 1, wherein the first direction is in the X-direction and wherein the second direction is in the Y-direction.

3. The method as recited in claim 2, wherein the connection traces electrically couple to one another at the I/O terminals between adjacent devices in the lead frame assembly, and wherein thin connection traces further couple the I/O terminals with die attach areas in the lead frame assembly.

4. The method as recited in claim 3, wherein, on the topside surface of the lead frame assembly, the connection traces are co-planar with one another and surfaces of the I/O terminals.

5. A semiconductor device assembled in a flat no-leads (FN) package, the semiconductor device comprising:
   a device die having bond pads providing connection to device die circuitry;
   a built-up substrate FN lead frame having,
      a sub-structure of I/O terminals and a die attach area, the I/O terminals and die attach area enveloped in a first molding compound, the die attach area having exposed areas to facilitate device die attachment thereon and the I/O terminals providing connection to the device die bond pads,
      connection traces electrically coupling the I/O terminals with one another, said connection traces having facilitated electroplating of exposed vertical surfaces of the I/O terminals during assembly, said connection traces being severed after assembly;
   a second molding compound encapsulating the device die onto the built-up substrate lead frame, the device die bonded to the die attach area, the device die bond pads connected to the I/O terminals; and
   wherein the I/O terminals have a stepped profile, the stepped profile having a plated vertical first face, a plated lead frame portion perpendicular to the plated vertical first face, and an exposed un-plated second vertical face perpendicular to the plated lead frame portion, the exposed un-plated second vertical surface enveloped in the second molding compound.

6. The semiconductor device as recited in claim 5,
   wherein the connection traces are co-planar with one another and a surface of the I/O terminals and the die attach area, and
   wherein the connection traces electrically couple to one another, the connection tracks oriented in X, Y and diagonal directions of the built-up substrate lead frame.

7. The semiconductor device as recited in claim 6, wherein the FN lead frame is selected from one of the following: quad-flat-pack leadless (QFN) and depopulated-very-thin flat-pack no leads (DFN).

8. A method for making a FN built-up lead frame whose I/O terminals can be electroplated on their vertical surfaces, the method comprises:
   selecting a FN lead frame assembly structure, the FN lead frame assembly structure having an having an array of sub-assemblies, each sub-assembly having a device position arranged thereon, the device die position having a first set I/O terminals on first side and on an opposite second side and a second set of I/O terminals on an adjacent third side and opposite fourth side, wherein the device die position and the first set and second set of I/O terminals are electrically connected to one another;
   molding the lead frame assembly structure, thereby forming a built-up lead frame assembly structure, wherein the molding and lead frame assembly structure are coplanar with one another.

9. The method as recited in claim 7, wherein the I/O terminals further include,
   connection traces that are co-planar with one another and a surface of the I/O terminals and the die attach area; and
   the connection traces electrically couple to one another and the I/O terminals, the connection traces oriented in X, Y and diagonal directions of the built-up substrate lead frame.

10. The method as recited in claim 9, wherein the FN built-up lead frame is selected from the following: quad-flat-pack leadless (QFN) and depopulated-very-thin flat-pack no leads (DFN).

\* \* \* \* \*